(12) United States Patent
Bajkowski et al.

(10) Patent No.: US 7,443,223 B2
(45) Date of Patent: Oct. 28, 2008

(54) LEVEL SHIFTING CIRCUIT

(75) Inventors: Maciej Bajkowski, Austin, TX (US);
George P. Hoekstra, Austin, TX (US);
Hamed Ghassemi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/468,815

(22) Filed: Aug. 31, 2006

(65) Prior Publication Data

US 2008/0054980 A1    Mar. 6, 2008

(51) Int. Cl.
*H03K 19/0175* (2006.01)
(52) U.S. Cl. .............................. 327/333; 326/81; 326/68
(58) Field of Classification Search ................. 327/306, 327/333; 326/80–81, 62–64, 68
See application file for complete search history.

(56) References Cited

U.S. PATENT DOCUMENTS

| | | | | |
|---|---|---|---|---|
| 5,530,392 A * | 6/1996 | Runas et al. | ................. | 327/333 |
| 5,982,211 A | 11/1999 | Ko | | |
| 6,081,153 A * | 6/2000 | Hamada et al. | ............. | 327/333 |
| 6,351,173 B1 * | 2/2002 | Ovens et al. | ................. | 327/333 |
| 6,563,357 B1 * | 5/2003 | Hsu et al. | .................... | 327/212 |
| 6,762,957 B2 * | 7/2004 | Hsu et al. | .............. | 365/189.05 |
| 6,842,046 B2 | 1/2005 | Tzartzanis et al. | | |
| 6,922,083 B2 * | 7/2005 | Tanaka et al. | .................. | 327/55 |
| 6,954,100 B2 | 10/2005 | Dharne et al. | | |
| 7,138,831 B2 * | 11/2006 | Tobita | .......................... | 326/81 |

OTHER PUBLICATIONS

Abdulkadir Utku Dirl, Yuvraj Dhillon, Abhijit Chatterjee, and Adit D. Singh, Level-Shifter Free Design of Low Power Dual Supply Voltage CMOS Circuits Using Dual Thresold Voltages, IEEE Transactions on Very Large Scale Integration (VSLI) Systems, vol. 13, No. 9, Sep. 2005, pp. 1103-1107.

Abdulkadir Utku Diri, Yuraj Singh Dhillon, Abhiji Chatterjee, and Adit D. Singh, Level-Shigter Free Design of Low Power Dual Supply Voltage CMOS Circuits Using Dual Thresold Voltages, 18th International Conference on VLSI Design held jointly with 4th International Conference on Embedded Systems Design (VLSID'05) 2005 IEEE.

* cited by examiner

*Primary Examiner*—Dinh T. Le
(74) *Attorney, Agent, or Firm*—David G. Dolezal; Robert L. King

(57) ABSTRACT

A level shifting circuit having a signal input that operates in a first voltage domain and a signal output that operates in a second voltage domain. In some embodiments, the level shifting circuit includes a clocked level shifter. In some embodiments, the level shifting circuit includes a level shifting latch that latches a translated output signal. In one example, the level shifting latch includes a latch portion and a stack of transistors with a transistor having a control electrode coupled to a clock input.

22 Claims, 3 Drawing Sheets

LEVEL SHIFTING CIRCUIT

BACKGROUND OF THE INVENTION

1. Field of the Invention

This invention relates to electronic circuitry and more specifically to a level shifting circuit for electronic circuitry.

2. Description of the Related Art

Level shifters are utilized for translating signals from one voltage domain to another voltage domain in an electronic circuit. For example, a level shifter may be utilized for a circuit having circuitry operating in a lower voltage domain and circuitry operating in a higher voltage domain, wherein the level shifter is used to translate the voltage level of a signal across the voltage domains.

Some level shifters require extra circuitry and/or they may be a source of substantial current leakage, especially if they lack the extra circuitry.

What is needed is an improved level shifter.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The features shown in the Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
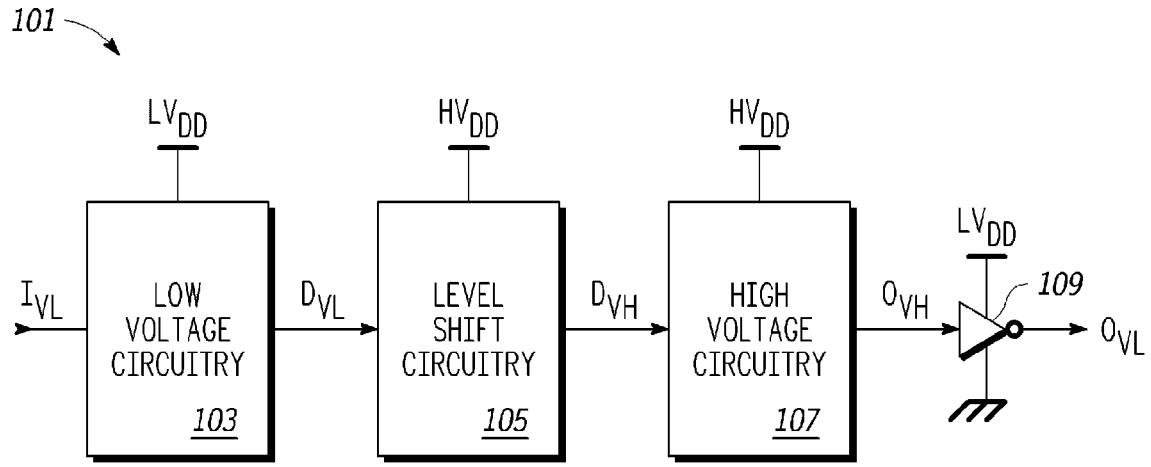
FIG. 1 is a block diagram of one embodiment of a circuit including level shifting circuitry according to one embodiment of the present invention.

FIG. 1 is a block diagram of a circuit with a level shifting circuit according to one embodiment of the present invention. Circuit 101 includes low voltage circuitry 103 and high voltage circuitry 107. Low voltage circuitry 103 operates in a low voltage domain wherein the circuitry is powered by a low voltage power supply ($LV_{DD}$), and high voltage circuitry 107 operates in a high voltage domain wherein the circuit is powered by a high voltage ($HV_{DD}$) power supply. The designation of "high voltage" and "low voltage" with respect to this embodiment is used to differentiate the power supplies by voltage level relative to each other.

In one embodiment, circuit 101 is a part of a memory system wherein the high voltage circuitry 107 includes a memory array (not shown) and associated circuitry (e.g. sense amplifiers and decoders). In such a system, low voltage circuitry 103 includes memory control, address, and data signals. In embodiments where circuit 101 includes a memory array, utilizing a level shifting circuit allows for the array to be powered by a higher voltage power supply for improved data retention while allowing neighboring control circuitry to operate at a lower voltage from a lower voltage power supply to reduce power. In other embodiments, circuit 101 may be part of other types of a systems and may include other types of circuitry.

FIG. 1 includes an input signal $I_{VL}$ that operates in a low voltage domain ($LV_{DD}$). In one example, a signal operates in a voltage domain where the transistors conveying the signal are referenced to the supply voltage level of the voltage domain. In one embodiment, signal $I_{VL}$ is a memory address or control signal. Low voltage circuitry 103 includes circuitry for generating a data signal $D_{VL}$ operating in the low voltage domain $LV_{DD}$. Data signal $D_{VL}$ is provided to level shift circuitry 105 which translates $D_{VL}$ to a high voltage domain ($HV_{DD}$) and latches the signal to produce signal $D_{VH}$ which is provided to high voltage circuitry 107. In one embodiment, signal $D_{VL}$ is a data signal conveying data to be stored in the memory array of circuitry 107.

Circuitry 107 produces a signal $O_{VH}$ that operates in the high voltage domain ($VH_{DD}$) that is level shifted by level shifting inverter 109 to operate in the low voltage domain ($LV_{DD}$). In one embodiment, $LV_{DD}$ is at +0.8 Volts and $HV_{DD}$ is at +1.0 volts. However, these voltages may be at other values in other embodiments.

Figure 2:
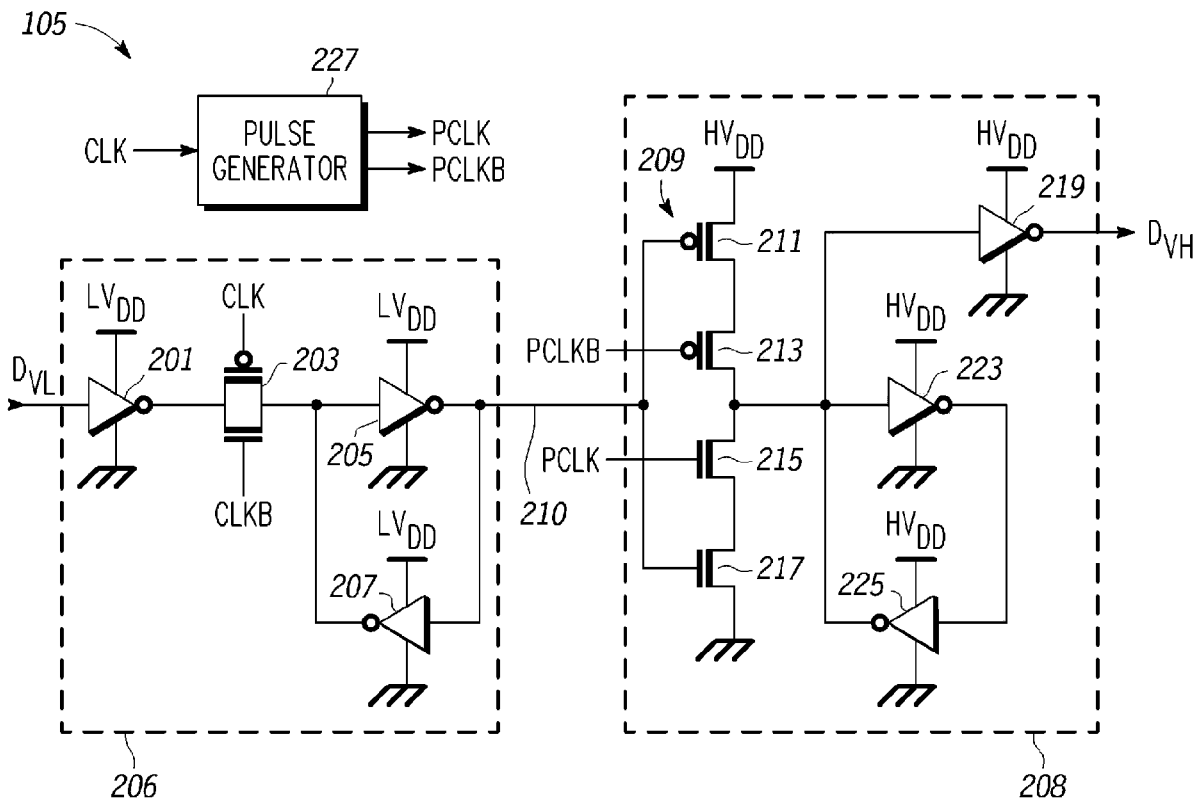
FIG. 2 is a circuit diagram of one embodiment of a circuit including level shifting circuitry according to one embodiment of the present invention.

FIG. 2 is a circuit diagram of one embodiment of level shift circuitry 105. In the embodiment shown, level shift circuitry 105 includes two latch circuits, latch circuit 206 and latch circuit 208. In the embodiment shown, latch circuit 206 is a master latch circuit and latch circuit 208 is a slave latch circuit.

Latch circuit 206 includes an inverter 201, a pass gate 203, and cross coupled inverters 205 and 207. Latch circuit 206 is located in the low voltage ($LV_{DD}$) domain with inverters 201, 205, and 207 being powered by low voltage power supply $LV_{DD}$. Latch circuit 206 latches at its output (node 210) the data of signal $D_{VL}$. The output of latch circuit 206 (node 210) is connected to the input of latch circuit 208. Node 210 operates in the low voltage ($LV_{DD}$) domain.

Level shifting latch circuit 208 includes a level shifting stack 209 of series connected transistors that includes P-channel MOSFET transistors 211 and 213 and N-channel (an opposite conductivity type to P-channel) MOSFET transistors 215 and 217. In other embodiments, other types of transistors may be utilized. Stack 209 is located in the high voltage ($HV_{DD}$) domain with the source (a current electrode of a MOSFET) of transistor 211 being connected to the $HV_{DD}$ power supply rail terminal. In the embodiment of FIG. 2, level shifting stack 209 operates as a clocked level shifter.

In the embodiment shown, the latched data signal of node 210 is connected to the gate (a control electrode of a MOSFET) of P-channel transistor 211 and the gate of N-channel transistor 217. This allows for a 0 or a 1 to be written into a slave latch circuit at a clock edge.

In one embodiment, the threshold voltage of transistor 211 is at a higher level (e.g. 300 mV) than the threshold voltages of at least some (or all in some embodiments) of transistors 213, 215, and 217 (e.g. . 200 mV). Providing level shifting stack 209 with a P-channel transistor with a higher threshold voltage may in some embodiments help to reduce leakage current through stack 209 during operation in that transistor 211 is more likely to be in a non conductive condition when node 210 is at a high voltage level. Because node 210 operates at the lower voltage domain, the high voltage level at node 210 may not be adequate enough to make transistor 211 non conductive if it had a lower threshold voltage.

Latch circuit 208 includes a latch portion of cross coupled inverters 223 and 225. Latch circuit 208 also includes inverter 219 for providing output $D_{VH}$ which is a latched and translated signal of the signal of node 210. Inverters 225, 223, and 219 are located in the high voltage ($HV_{DD}$) domain with their power supply rail terminals connected to the high voltage ($HV_{DD}$) power supply. Signal $D_{VH}$ operates in the high voltage domain.

In the embodiment shown, the gate of transistor 215 is coupled to receive a "pulse" clock signal (PCLK) and the gate of transistor 213 is coupled to receive the complementary pulse clock bar signal (PCLKB) which is an inverted signal of the PCLK signal. In the embodiment shown, circuitry 105 includes a pulse generator circuit 227 that produces the pulse clock signals PCLK and PCLKB from the clock signal CLK. In the embodiment shown, the clock signals CLK and CLKB operate in the low voltage domain ($LV_{DD}$) and clock signals PCLK and PCLKB operate in the high voltage domain ($HV_{DD}$). In one embodiment, the duty cycle of the PCLK clock signal is shorter than the duty cycle of the CLK signal. Also in some embodiments, the frequency of the occurrence of the pulse of signals PCLK and PCLKB is less (e.g. ½, ⅓) of the frequency of the CLK signal. In some embodiments, the occurrences of the pulses of the PCLK and PCLKB signals (e.g. the frequency of the pulse clock signals) are reduced by gating the clock signal CLK during the production of the PCLK and PCLKB signals from the CLK signal. In one embodiment, this gating may be performed with the use of a periodically generated enable signal (not shown). However, frequency reduction of the PCLK and PCLKB signals may be accomplished by other methods in other embodiments.

In other embodiments, pulse generator circuit 227 may be located in other parts of circuit 101 including those not shown. Also in other embodiments, the PCLK and PCLKB signals may be provided to other level shifting circuitry (not shown).

Figure 3:
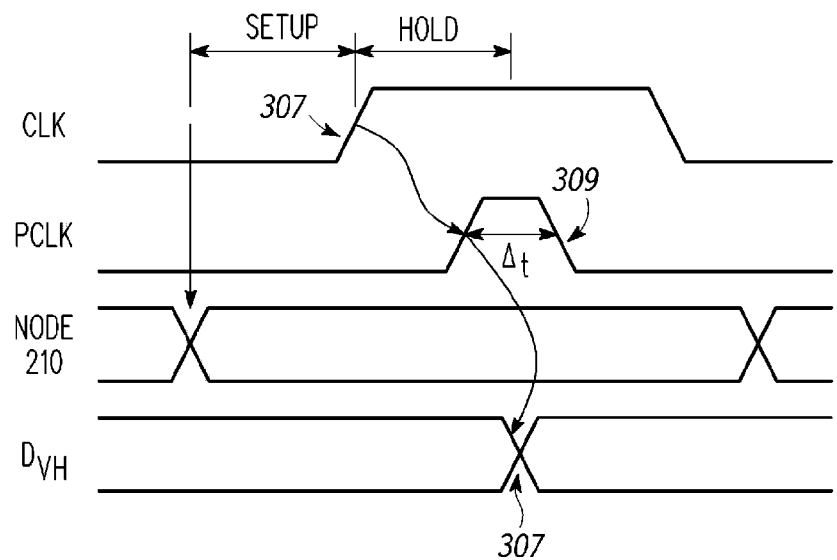
FIG. 3 shows one embodiment of a timing diagram of the circuit of FIG. 2.

FIG. 3 is a timing diagram showing one embodiment of the operation of circuitry 105. In the embodiment of FIG. 3, signal $D_{VL}$ remains latched at node 210 in a state for a least a particular period of time (referred to as "set up") prior to the CLK signal going high. In one embodiment, signal at node 210 changes state in response to the CLK signal going low at a previous period of the CLK signal.

In the embodiment shown, the CLK signal going high at time 307 causes the PCLK signal to go high at a subsequent time. In one embodiment, the PCLK signal goes high for a predetermined length (labeled "delta t" in FIG. 3). The time at which the PCLK signal is high is referred to subsequently as the "pulse time" of the PCLK signal. The PCLKB signal is a complementary signal to the PCLK signal with the "pulse time" being when the PCLKB signal is at a low value. During the pulse time of the PCLK signal, transistors 213 and 215 of FIG. 2 are conducting such that signal $D_{VH}$ changes state to match the state of node 210 (which is a latched value of signal $D_{VL}$). The value of $D_{VH}$ is then latched at its value when the PCLK signal transitions back to a low value at time 309. The signal at node 210 remains at its state until after the CLK level goes low. Afterwards, the signal at node 210 is allowed to transition to the next state for the next bit of data from the $D_{VL}$ signal to be conveyed.

In the embodiment shown, the state of the signal of node 210 holds state during the pulse time of the PCLK signal and its value remains latched as the $D_{VH}$ signal subsequent to that time. During the pulse time of PCLK, transistors 213 and 215 are conductive such that the logic value of $D_{VH}$ is controlled by the voltage at node 210. When the PCLK and PCKLB signals are at times other than the pulse time, the input of inverter 219 is electrically isolated from $HV_{DD}$ power supply reference terminal and the ground power supply reference terminal. Because in the embodiment shown, the pulse time of the PCLK signal is relatively shorter than the corresponding phase of the CLK signal, the time that stack 209 may be conductive is minimized. Accordingly, the amount of power being consumed by level shifting stack 209 is also reduced.

In embodiments where the pulse time of the PCLK signal occurs at a frequency less than the frequency of CLK signal (e.g. where the PCLK signal is gated with respect to the clock signal), further power may be saved due to the PCLK signal making transistors 213 and 215 of stack 209 conductive at lesser intervals than that of the CLK signal.

In some embodiments, pulse generator circuit 227 produces signals PCLK and PCLKB with a "pulse time" that is independent of the duty cycle of the CLK signal. In these embodiments, the pulse time of the PCLK and PCLKB signal is "fixed" and independent of the duration of the corresponding phase of the CLK signal used to generate the pulse time of the PCLK and PCLKB signals. In one embodiment, the fixed amount of time would be just long enough for inverters 223 and 225 to switch states. With such an embodiment, the power consumption of latch circuit 208 would be minimized regardless of the frequency at which the CLK signal is operated. In other embodiments, the PCLK and PCLKB pulse clock signals may have the same frequency and/or duty cycle as the CLK signal.

In other embodiments, circuit 101 may have other configurations. For example level shift circuitry 105 may have other configurations. As an example, shift circuitry 105 may not include a master latch circuit 206 in some embodiments. Also in other embodiments, the power supply rail labeled $LV_{DD}$ in FIG. 2 may be at a higher voltage than the power supply rail labeled $HV_{DD}$ such that shift circuitry 105 may be used for translating a signal from a higher voltage domain to a lower voltage domain. Also in other embodiments, level shifting latch circuit 208 may not include inverter 219. Further in other embodiments, the PCLK and PCLKB signals may be produced by other methods.

Figure 4:
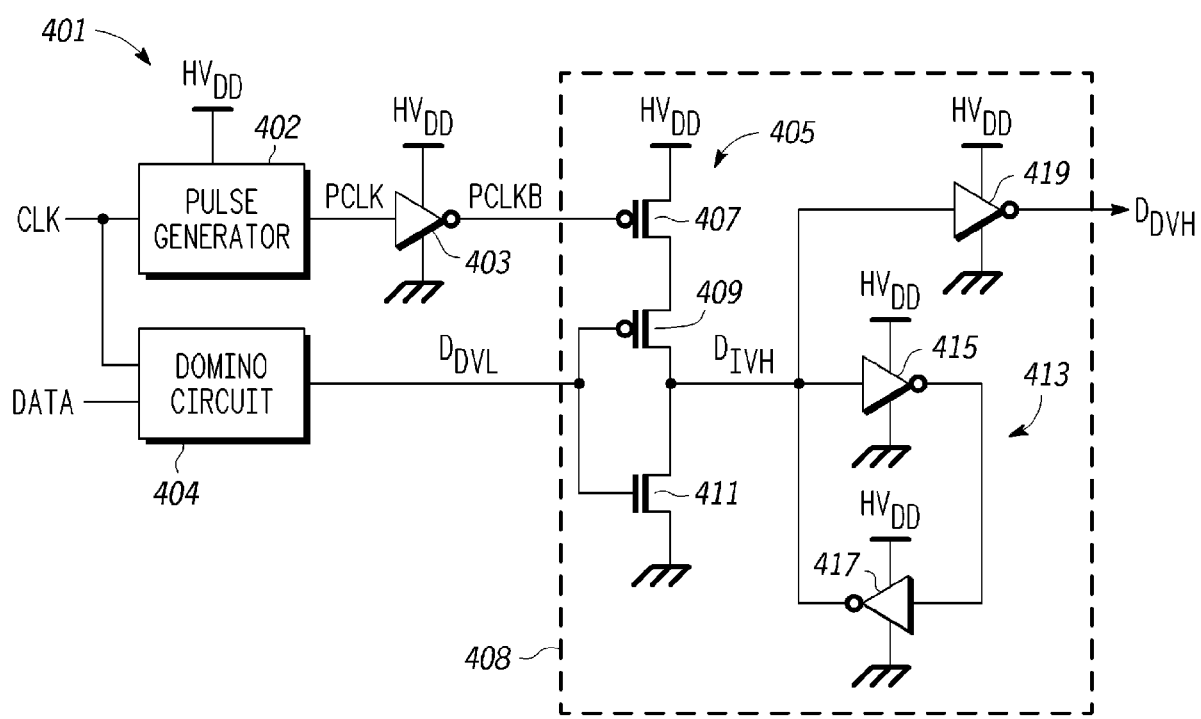
FIG. 4 is a circuit diagram of one embodiment of a circuit including level shifting circuitry according to one embodiment of the present invention.

FIG. 4 is a circuit diagram of level shift circuitry according to another embodiment of the present invention. Level shift circuitry 401 in FIG. 4, may be utilized in place of level shift circuitry 105 in FIG. 1. In the embodiment shown, level shift circuitry 401 includes a level shifting latch 408 and domino circuit 404. Circuitry 401 also includes a pulse generator 402 and inverter 403 for generating a PCLKB signal from the CLK signal. In the embodiment of FIG. 4, circuitry 401 does not include a master latch. Domino circuit 404 includes domino circuitry clocked by the CLK signal.

Level shifting latch 408 includes a level shift stack 405 of series connected transistors having an input to receive a data signal ($D_{DVL}$). The $D_{DVL}$ signal operates in the low voltage domain ($LV_{DD}$). Stack 405 includes transistors 407, 409, and 411. In one embodiment, transistor 409 has a higher threshold voltage than transistors 407 and 411. As discussed earlier, this higher voltage threshold may advantageously reduce leakage current through stack 405 due to the fact that the $D_{DVL}$ signal operates at the lower voltage domain and may have an insufficient high voltage level to shut off transistor 409 if it had a lower threshold voltage.

Stack 405 produces an intermediate data signal $D_{IVH}$ that is latched by latch portion 413 (cross coupled inverters 415 and 417) and inverted by inverter 419 to produce the $D_{DVH}$ signal.

Inverters 415, 417, and 419 are located in the high voltage domain ($HV_{DD}$) wherein their power supply rail terminals are coupled to a high voltage power supply ($HV_{DD}$).

Figure 5:
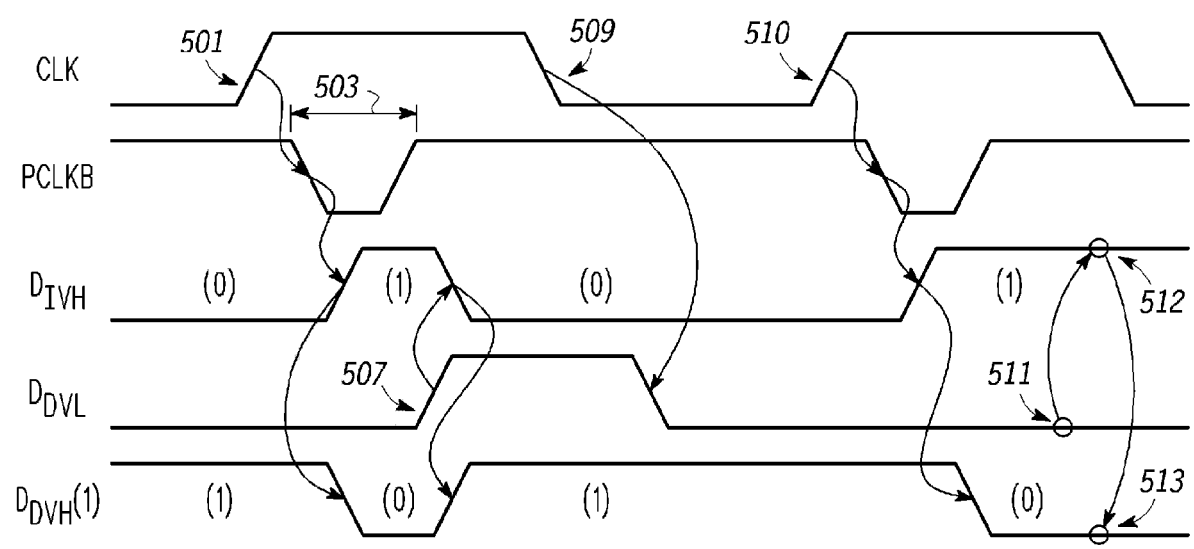
FIG. 5 shows one embodiment of a timing diagram of the circuit of FIG. 4.

FIG. 5 is a timing diagram showing one embodiment of the operation of circuitry 401. In the embodiment of FIG. 5, the $D_{IVH}$ signal is initially at a low voltage level (0 state) and the $D_{DVH}$ signal is initially at a high voltage level (1 state) due to a previously value stored in latch 408. Signal $D_{DVL}$ is at a low voltage level due to its stage in the timing cycle of the CLK signal. In the embodiment of FIG. 5, the CLK signal going high at time 501 causes the PCLK signal to go high which causes the PCLKB to go low (referred to as pulse time 503). The PCLKB signal going low causes the $D_{IVH}$ signal to precharge to a high value (1 state) which precharges signal $D_{DVH}$ to a low value. At time 507, the $D_{DVL}$ signal is at a time in its cycle where it conveys information. In the embodiment shown, $D_{DVL}$ changes to a high voltage level (1 state) at time 507 to convey information associated with the 1 state. The $D_{DVL}$ signal going to a high voltage level at time 507 pulls $D_{IVH}$ to a low level (0 state) which causes $D_{DVH}$ to latch at a high voltage level (1 state).

At time 509, the CLK signal transitions to a low level. The output of domino circuit 404 ($D_{DVL}$ signal) precharges to a low level in response to the CLK signal transitioning to a low level at that time.

At time 510, the CLK signal transitions to a high level causing the PCLKB signal to go to a low level which thereby precharging the $D_{IVH}$ signal to a high level and precharging the $D_{DVH}$ signal to a low level. At time 511, signal $D_{DVL}$ is at a time in its cycle where it conveys information. Because the $D_{DVL}$ is at a low voltage level to convey information associated with the low voltage level just subsequent to time 511, it causes the $D_{IVH}$ signal to remain at a high voltage level just subsequent to time 512 which causes the $D_{DVH}$ signal to remain at the low voltage level just subsequent to time 513.

One advantage that may occur with the embodiment of FIG. 4 is that transistor 407 is non conducting when the data is being shifted through stack 405, thereby reducing power consumption.

Although two embodiments of a level shifting latch circuit (latch circuits 208 and 408) are shown in FIGS. 2 and 4 respectively, a level shifting latch may have other configurations in other embodiments. Although two embodiments of a clocked level shifter (stacks 209 and 405) are shown in FIGS. 2 and 4 respectively, a clocked level shifter may have other configurations in other embodiments.

In one embodiment, a circuit includes a clocked level shifter including a signal input. The signal input operates within a first voltage domain. The clocked level shifter includes a signal output for operating within a second voltage domain that differs from the first voltage domain. The clocked level shifter includes a clock input for receiving a clock signal. The circuit includes a latch coupled to an output of the clocked level shifter.

In another embodiment, a method includes providing a signal input for receiving an input signal. The input signal operates in a first voltage domain. The method also includes providing a pair of transistors of opposite conductivity type coupled in series. Each transistor of the pair includes a control electrode coupled to the signal input. The pair of transistors of opposite conductivity type providing an output signal at a signal output. The output signal operates in a second voltage domain. The second voltage domain differs from the first voltage domain. The method includes providing a latch coupled to the signal output for latching the output signal and providing a P-channel transistor coupled in series with the pair of transistors of opposite conductivity type. The P-channel transistor has a control electrode for receiving a signal to electrically isolate the signal output from a power supply terminal of the second voltage domain.

In another embodiment, a level shifting circuit includes a signal input for receiving a signal in a first voltage domain and a clocked level shifter coupled to the signal input and to a power supply terminal for receiving a supply voltage different from the first voltage domain. The clocked level shifter includes a signal output for providing an output signal and a clock input for receiving a clock signal for electrically isolating the power supply terminal from the signal output.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
    a clocked level shifter including a signal input, the signal input is coupled to an output of circuitry, the signal input for operating within a first voltage domain, the clocked level shifter including a signal output for operating within a second voltage domain that differs from the first voltage domain, wherein the clocked level shifter includes a clock input for receiving a clock signal, wherein the clock signal has a pulse time with a duration that is shorter than clock phase durations of a second clock signal received by the circuitry and used to provide information to the signal input;
    a latch coupled to an output of the clocked level shifter.

2. The circuit of claim 1 wherein the clocked level shifter further comprises:
    a level shifting stack of series-connected transistors wherein two of the series-connected transistors are of opposite conductivity types and include a control electrode coupled to the signal input, the level shifting stack including another of the series-connected transistors including a control electrode coupled to clock input.

3. The circuit of claim 1 wherein the clock signal has a pulse time with a duration that is independent of clock phase durations of a second clock signal used to provide information to the signal input.

4. The circuit of claim 1 wherein the clock signal has a pulse time with a duration that is independent of a duration of a clock phase of a second clock signal used to generate the pulse time.

5. The circuit of claim 1 wherein the clock signal has a pulse time with a duration that is shorter than a duration of a clock phase of a second clock signal used to generate the pulse time.

6. The circuit of claim 1 wherein the clock signal has a frequency that is less than a frequency a second clock signal used to provide information to the signal input.

7. The circuit of claim 1 wherein the clock signal has a frequency which is less than a frequency a second clock signal used to generate the clock signal.

8. The circuit of claim 1 wherein the clocked level shifter further comprises:
    a level shifting stack of series-connected transistors wherein a first transistor of the series-connected transistors includes a control electrode coupled to the signal input and has a threshold voltage that is greater in magnitude than a threshold voltage of at least some of a remainder of the series-connected transistors.

9. The circuit of claim 8 wherein the first transistor is a P-channel type MOSFET.

10. A circuit comprising:
a clocked level shifter including a signal input, the signal input for operating within a first voltage domain, the signal input is coupled to an output of circuitry, the clocked level shifter including a signal output for operating within a second voltage domain that differs from the first voltage domain, wherein the clocked level shifter includes a clock input for receiving a clock signal, wherein the clock signal has a pulse time with a duration that is shorter than clock phase durations of a second clock signal received by the circuitry and used to provide information to the signal input;
a latch coupled to an output of the clocked level shifter;
wherein the clocked level shifter further comprises:
a first transistor of a first conductivity type including a first current electrode coupled to a power supply terminal of the second voltage domain, a control electrode coupled to the signal input and for operating within the first voltage domain, and a second current electrode;
a second transistor of the first conductivity type having a first current electrode coupled to the second current electrode of the first transistor, a control electrode for receiving the clock signal, and a second current electrode coupled to the signal output;
a third transistor of a second conductivity type having a first current electrode coupled to the second current electrode of the second transistor, a control electrode for receiving an inverse signal of the clock signal, and a second current electrode; and
a fourth transistor of the second conductivity type having a first current electrode coupled to the second current electrode of the third transistor, a control electrode coupled to the signal input and for operating within the first voltage domain, and a second current electrode coupled to a second power supply terminal.

11. The circuit of claim 10 wherein the clock signal has a pulse time with a duration that is shorter than clock phase durations of a second clock signal used to provide information to the signal input.

12. The circuit of claim 10 further comprising:
a latch circuit including the clocked level shifter and the latch;
a master latch circuit having an output coupled to the signal input wherein the latch circuit is characterized as a slave latch circuit to the master latch circuit.

13. The circuit of claim 10 wherein the first transistor has a threshold voltage that is greater in magnitude than a threshold voltage of each of the third transistor and the fourth transistor.

14. A method, comprising:
providing a signal input for receiving an input signal, the input signal operating in a first voltage domain, the signal input is coupled to an output of circuitry;
providing a pair of transistors of opposite conductivity type coupled in series, each transistor of the pair including a control electrode coupled to the signal input and for operating in the first voltage domain, the pair of transistors of opposite conductivity type providing an output signal at a signal output, the output signal operating in a second voltage domain, wherein the second voltage domain differs from the first voltage domain;
providing a latch coupled to the signal output for latching the output signal; and
providing a P-channel transistor coupled in series with the pair of transistors of opposite conductivity type, the P-channel transistor having a control electrode for receiving a first signal to electrically isolate the signal output from a power supply terminal of the second voltage domain, wherein the first signal has a pulse time with a duration that is shorter than clock phase durations of a clock signal received by the circuitry and used to provide information to the signal input.

15. The method of claim 14 further wherein the providing a pair of transistors includes providing a P-channel transistor of the pair of transistors with a threshold voltage that is larger than a threshold voltage of a corresponding N-channel transistor of the pair of transistors.

16. A level shifting circuit comprising:
a signal input for receiving a signal in a first voltage domain, the signal input is coupled to an output of circuitry; and
a clocked level shifter coupled to the signal input and to a power supply terminal for receiving a supply voltage different from the first voltage domain, the clocked level shifter includes a signal output for providing an output signal and a clock input for receiving a clock signal for electrically isolating the power supply terminal from the signal output, wherein the clocked level shifter includes a stack of series connected transistors with two transistors of the stack of series connected transistors having control electrodes coupled to the signal input and for operating in the first voltage domain, wherein the stack of series connected transistors includes a P-channel transistor having a control electrode coupled to the clock input, wherein the clock signal has a pulse time with a duration that is shorter than clock phase durations of a second clock signal received by the circuitry and used to provide information to the signal input.

17. The level shifting circuit of claim 16 wherein the level shifting circuit is configured such that the clock signal electrically isolates the power supply terminal from the signal output for a portion of a clock cycle of a second clock signal used for controlling information flow to the signal input.

18. The level shifting circuit of claim 16 wherein the stack of series connected transistors further comprises:
a first transistor of a first conductivity type including a first current electrode coupled to the power supply terminal, a control electrode for receiving the clock signal, and a second current electrode, wherein the first transistor is the P-channel transistor;
a second transistor of the first conductivity type including a first current electrode coupled to the second current electrode of the first transistor, a control electrode coupled to the signal input, and a second current electrode coupled to the signal output;
a third transistor of a second conductivity type opposite the first conductivity type and including a first current electrode coupled to the signal output, a control electrode coupled to the signal input, and a second current electrode coupled to a second power supply terminals;
wherein the second and third transistors are the two transistors.

19. The level shifting circuit of claim 18 wherein the second transistor is a P-channel transistor and has a threshold voltage that is larger than a threshold voltage of the third transistor.

20. The level shifting circuit of claim 16 wherein stack of series connected transistors further comprises:
a first transistor of a first conductivity type including a first current electrode coupled to the power supply terminal, a control electrode coupled to the signal input, and a second current electrode;

a second transistor of the first conductivity type including a first current electrode coupled to the second current electrode of the first transistor, a control electrode coupled to the clock signal, and a second current electrode coupled to the signal output wherein the second transistor is the p-channel transistor;

a third transistor of a second conductivity type opposite the first conductivity type and including a first current electrode coupled to the signal output, a control electrode coupled to a complementary clock signal of the clock signal and a second current electrode;

a fourth transistor of the second conductivity type including a first current electrode coupled to the second current electrode of the third transistor, a control electrode coupled to the signal input, and a second current electrode coupled to a second power supply terminal;

wherein the first and fourth transistors are the two transistors.

21. The level shifting circuit of claim 16 further comprising a latch coupled to the signal output for latching a signal of the signal output.

22. The level shifting circuit of claim 16 wherein the supply voltage is of a higher voltage than the voltage of the first voltage domain.

* * * * *